(12) United States Patent
Kuo et al.

(10) Patent No.: US 10,304,813 B2
(45) Date of Patent: May 28, 2019

(54) DISPLAY DEVICE HAVING A PLURALITY OF BANK STRUCTURES

(71) Applicant: Innolux Corporation, Miao-Li County (TW)

(72) Inventors: Shu-Ming Kuo, Miao-Li County (TW); Chih-Yung Hsieh, Miao-Li County (TW); Kuan-Feng Lee, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 15/341,007

(22) Filed: Nov. 2, 2016

(65) Prior Publication Data

US 2017/0133357 A1  May 11, 2017

Related U.S. Application Data

(60) Provisional application No. 62/251,132, filed on Nov. 5, 2015.

(30) Foreign Application Priority Data

Jun. 6, 2016 (CN) .......................... 2016 1 0395404

(51) Int. Cl.
  *H01L 25/16* (2006.01)
  *H01L 25/07* (2006.01)
  (Continued)

(52) U.S. Cl.
  CPC ............ *H01L 25/167* (2013.01); *H01L 33/48* (2013.01); *H01L 33/502* (2013.01); *H01L 33/56* (2013.01);
  (Continued)

(58) Field of Classification Search
  CPC ....... H01L 33/48; H01L 33/502; H01L 33/56; H01L 33/58; H01L 33/60;
  (Continued)

(56) References Cited

U.S. PATENT DOCUMENTS 4,630,180 A * 12/1986 Muraki ..................... F21V 5/04
  257/E25.02
6,900,072 B2 * 5/2005 Patel ..................... B81B 7/0077
  257/678

(Continued)

FOREIGN PATENT DOCUMENTS

CN     104838508   8/2015
WO     2015083823  6/2015

OTHER PUBLICATIONS

Office Action of China Counterpart Application, dated Dec. 19, 2018, pp. 1-7.

*Primary Examiner* — Ida M Soward
(74) *Attorney, Agent, or Firm* — JCIPRNET

(57) ABSTRACT

The embodiment provides a display device including an array substrate, an opposite substrate, a plurality of micro light-emitting diodes and a plurality of bank structures. The opposite substrate is disposed opposite to the array substrate. The micro light-emitting diodes are arranged in an array on the array substrate, wherein the micro light-emitting diodes are electrically connected to the array substrate. The bank structures are located between the array substrate and the opposite substrate, wherein the bank structures form a plurality of accommodating regions, and one of the micro light-emitting diodes is located in one of the accommodating regions. A height of the bank structures is more than or equal to a height of the micro light-emitting diodes.

14 Claims, 11 Drawing Sheets

(51) Int. Cl.
  *H01L 25/13* (2006.01)
  *H01L 25/18* (2006.01)
  *H01L 33/48* (2010.01)
  *H01L 33/50* (2010.01)
  *H01L 33/56* (2010.01)
  *H01L 33/58* (2010.01)
  *H01L 33/60* (2010.01)
  *H01L 25/075* (2006.01)

(52) U.S. Cl.
  CPC .............. *H01L 33/58* (2013.01); *H01L 33/60* (2013.01); *H01L 25/075* (2013.01); *H01L 25/0756* (2013.01); *H01L 25/13* (2013.01); *H01L 25/16* (2013.01); *H01L 25/18* (2013.01); *H01L 2933/0083* (2013.01); *H01L 2933/0091* (2013.01)

(58) Field of Classification Search
  CPC .... H01L 25/075–25/0756; H01L 25/13; H01L 25/16–25/167; H01L 25/18
  See application file for complete search history.

(56) References Cited

U.S. PATENT DOCUMENTS

| | | | | |
|---|---|---|---|---|
| 7,531,847 B2* | 5/2009 | Shitagaki | ............... | H05B 33/04 257/100 |
| 7,550,306 B2* | 6/2009 | Park | .................... | H01L 27/3253 438/149 |
| 7,563,147 B2* | 7/2009 | Sakai | .................. | H01L 51/0021 313/504 |
| 7,592,593 B2* | 9/2009 | Kauffman | ................. | G01J 3/36 250/332 |
| 7,745,241 B2* | 6/2010 | Chang | .................... | H01L 24/97 257/99 |
| 7,751,458 B2* | 7/2010 | Regaard | ................ | H01S 5/4012 372/101 |
| 7,838,314 B2* | 11/2010 | Choi | ..................... | H01L 51/524 257/E21.259 |
| 7,868,543 B2* | 1/2011 | Kobayashi | .......... | H01L 51/5271 313/503 |
| 7,932,672 B2* | 4/2011 | Nakanishi | ........... | H01L 27/3276 257/79 |
| 8,551,794 B2* | 10/2013 | Lin | ........................ | H01L 23/055 257/99 |
| 8,563,994 B2* | 10/2013 | Harada | ............... | H01L 51/5048 257/79 |
| 9,443,785 B2* | 9/2016 | Yu | ........................ | H01L 23/3107 |
| 9,620,487 B2* | 4/2017 | Sakariya | ............ | H01L 25/0753 |
| 10,062,320 B2* | 8/2018 | Illek | ......................... | G09G 3/32 |
| 2005/0116620 A1* | 6/2005 | Kobayashi | .......... | H01L 51/5271 313/503 |
| 2009/0015136 A1* | 1/2009 | Lee | ..................... | H01L 51/5246 313/503 |
| 2009/0167132 A1* | 7/2009 | Bae | ...................... | H01L 51/5246 313/1 |
| 2010/0320482 A1* | 12/2010 | Tachibana | ............. | H05K 3/284 257/88 |
| 2011/0180818 A1* | 7/2011 | Lerman | ............... | H01L 25/0753 257/88 |
| 2012/0012887 A1* | 1/2012 | Yamazaki | ........... | H01L 27/3244 257/99 |
| 2012/0092324 A1* | 4/2012 | Buchan | ............... | G02B 26/0833 345/418 |
| 2013/0037831 A1* | 2/2013 | Rudmann | ............. | H01L 25/167 257/88 |
| 2013/0126839 A1* | 5/2013 | Matsushima | ....... | H01L 27/3246 257/40 |
| 2013/0126844 A1* | 5/2013 | Nishiyama | .......... | H01L 27/3246 257/40 |
| 2015/0115138 A1* | 4/2015 | Heng | .................... | G01J 1/0407 250/216 |
| 2015/0295140 A1* | 10/2015 | Aoyagi | ............... | H01L 25/0753 257/99 |
| 2016/0293554 A1* | 10/2016 | Tan | ........................ | H01L 23/5385 |
| 2016/0372397 A1* | 12/2016 | Yu | ........................ | H01L 23/3107 |
| 2016/0372528 A1* | 12/2016 | Kamura | ............... | H01L 51/0096 |
| 2017/0077076 A1* | 3/2017 | Wang | ..................... | H01L 21/56 |
| 2017/0153128 A1* | 6/2017 | Rudmann | ................ | G01D 5/30 |
| 2018/0049311 A1* | 2/2018 | Hoang | ................... | H05K 1/181 |
| 2018/0124882 A1* | 5/2018 | Edwards | ............ | H05B 33/0803 |

* cited by examiner

DISPLAY DEVICE HAVING A PLURALITY OF BANK STRUCTURES

CROSS-REFERENCE TO RELATED APPLICATION

This application claims the priority benefits of U.S. provisional application Ser. No. 62/251,132, filed on Nov. 5, 2015 and China application serial no. 201610395404.4, filed on Jun. 6, 2016. The entirety of each of the above-mentioned patent applications is hereby incorporated by reference herein and made a part of this specification.

BACKGROUND

Field of the Disclosure

The embodiment relates to a display device, and particularly relates to a light-emitting diode display device.

Description of Related Art

Since a light-emitting diode (LED) display device has advantages such as active light emitting, high brightness, high contrast, and low power consumption, and has a longer lifetime compared to an organic light-emitting diode (OLED) display device, it has become one of the technologies of new type displays to develop in recent years. Specifically, the light-emitting diode display device is mainly composed of a thin film transistor array substrate and light-emitting diodes arranged in an array. The optical performance of the light-emitting diode display device depends on the design of the light-emitting diodes and the optical structure design of the periphery of the light-emitting diodes. Since the light-emitting diode is a multi-surface light-emitting light source, lateral light of the light-emitting diode emitting onto the adjacent light-emitting diode is likely to result in an optical cross-talk phenomenon after the light-emitting diodes are closely arranged in an array, which may cause disadvantages, such as color mixing, halo, reduction of screen contrast or fuzziness. Also, it is possible to reduce color saturation of the light-emitting diode display device when including a wavelength converting material.

SUMMARY

The embodiment provides a display device which has a better optical display performance.

The display device of the embodiment includes an array substrate, a plurality of micro light-emitting diodes and a plurality of bank structures. The micro light-emitting diodes are arranged in an array on the array substrate. The bank structures are located on the array substrate, wherein the micro light-emitting diodes are electrically connected to the array substrate. The bank structures form a plurality of accommodating regions, and one of the micro light-emitting diodes is located in one of the accommodating regions. A height of one of the bank structures is more than or equal to a height of one of the micro light-emitting diodes.

The display device of the embodiment includes an array substrate, an opposite substrate, a plurality of micro light-emitting diodes and a plurality of bank structures. The opposite substrate is disposed opposite to the array substrate. The micro light-emitting diodes are arranged in an array on the array substrate. The bank structures are located between the array substrate and the opposite substrate. The micro light-emitting diodes are electrically connected to the array substrate. The bank structures form a plurality of accommodating regions, and one of the micro light-emitting diodes is located in one of the accommodating regions. A height of one of the bank structures is more than or equal to a height of the one of the micro light-emitting diodes.

The display device of the embodiment includes an array substrate, an opposite substrate, a plurality of micro light-emitting diodes, a wavelength converting enhancement layer, a color filter layer and a plurality of bank structures. The opposite substrate is disposed opposite to the array substrate. The micro light-emitting diodes are arranged in an array on the array substrate. The wavelength converting enhancement layer is disposed above the opposite substrate. The color filter layer is disposed above the opposite substrate and has a plurality of color filter patterns. The bank structures are located between the array substrate and the opposite substrate. The micro light-emitting diodes are electrically connected to the array substrate. The bank structures form a plurality of accommodating regions, and one of the micro light-emitting diodes is located in one of the accommodating regions. A height of one of the bank structures is more than or equal to a height of the one of the micro light-emitting diodes.

Based on the above, since the display device of the embodiment has the design of the bank structures, the optical cross-talk phenomenon generated by the micro light-emitting diodes arranged in an array on the array substrate can be effectively reduced. Thereby, the optical display performance of the display device of the embodiment can be effectively improved.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the embodiments, and are incorporated in and constitute a part of this specification. The drawings illustrate embodiments and, together with the description, serve to explain the principles of the embodiments.

DESCRIPTION OF THE EMBODIMENTS

Figure 1A:
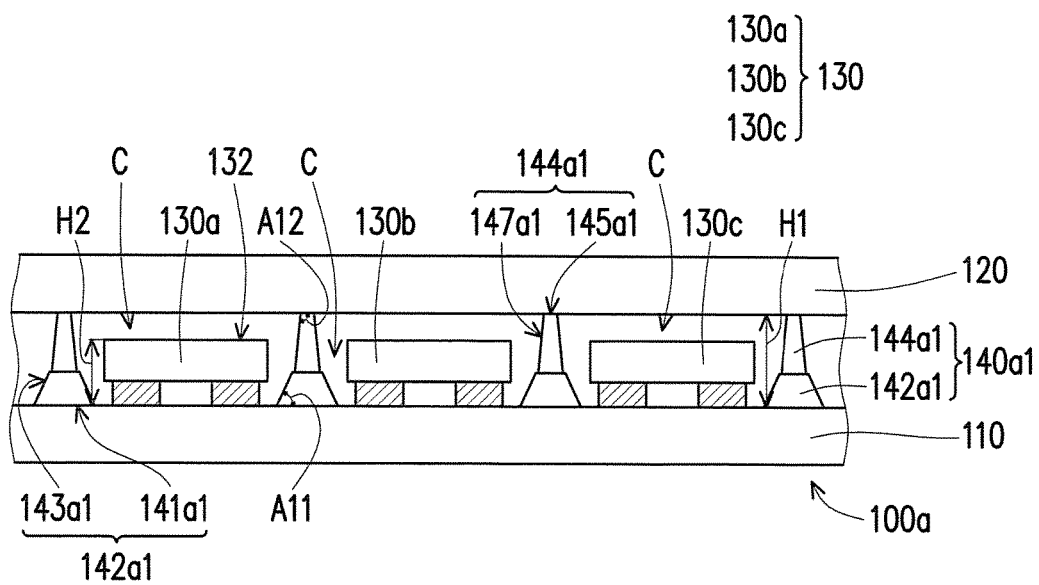
FIG. 1A is a schematic cross-sectional view of a display device according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1A is a schematic cross-sectional view of a display device according to an embodiment. Referring to FIG. 1A, in the embodiment, a display device 100a includes an array substrate 110, an opposite substrate 120, a plurality of micro light-emitting diodes 130 and a plurality of bank structures 140a1. The array substrate 110 is a thin film transistor (TFT) array substrate, for example. In other words, a plurality of thin film transistors can be arranged on the array substrate 110. The opposite substrate 120 is disposed opposite to the array substrate 110. The micro light-emitting diodes 130 are arranged in an array on the array substrate 110, wherein the micro light-emitting diodes 130 are electrically connected to the array substrate 110. Specifically, the micro light-emitting diodes 130 are electrically connected to the thin film transistors on the array substrate 110. The bank structures 140a1 are located between the array substrate 110 and the opposite substrate 120, wherein the bank structures 140a1 form a plurality of accommodating regions C. In other words, the plurality of accommodating regions C can be separated by the adjacent bank structures 140a1, and at least one of the micro light-emitting diodes 130 is located in at least one of the accommodating regions C. A height H1 of at least one of the bank structures 140a1 is more than a height H2 of at least one of the micro light-emitting diodes 130, and a width of at least one of the bank structures 140a1 can be different. The height H2 of at least one of the micro light-emitting diodes 130 may be a distance between a top surface of the array substrate 110 and an upper surface 132 of at least one of the micro light-emitting diodes 130 as shown in FIG. 1A.

Specifically, referring to FIG. 1A, at least one of the micro light-emitting diodes 130 can be electrically connected to a source or a drain (not shown) of at least one of the thin film transistors (not shown) on the array substrate 110 by a conductive structure (not shown), and at least one of the micro light-emitting diodes 130 can be electrically connected to a common electrode (not shown) of the array substrate 110 by a conductive structure (not shown). Here, the micro light-emitting diodes 130 are flip-chip micro light-emitting diodes, for example, and the micro light-emitting diodes 130 specifically includes a blue light micro light-emitting diode 130a, a green light micro light-emitting diode 130b, and a red light micro light-emitting diode 130c. The size of the micro light-emitting diodes 130 from top view is between 1 micrometer and 1000 micrometers. In an embodiment, the size is between 1 micrometer and 100 micrometers. The shape of the micro light-emitting diodes 130 might be a rectangle, a circle or other shapes, and is not limited thereto. The size of the micro light-emitting diodes 130 from top view can be the longest distance within a profile of one of the micro light-emitting diodes 130. The profile is defined by an outline of a projected image of one of the micro light-emitting diodes 130 from top view. The height H2 of at least one of the micro light-emitting diodes 130 is between 0.5 micrometers and 500 micrometers, for example. In an embodiment, the height H2 of at least one of the micro light-emitting diodes 130 is between 0.5 micrometers and 30 micrometers, for example. That is to say, the micro light-emitting diodes 130 of the embodiment can emit light with different colors specifically. However, in other embodiments, the micro light-emitting diodes 130 may also emit light with the same color, and is not limited thereto. The opposite substrate 120 may be a cover plate (e.g., transparent substrate) or a color filter substrate, for example. However, in other embodiments, the opposite substrate 120 may also be a thin film encapsulation or a protective layer with protective and supporting effects. The protective layer may be a planarization layer, which can be disposed on the array substrate 110 such that the surface of the array substrate 110 is planarized. For example, the protective layer may be disposed around the micro light-emitting diodes 130, or may be disposed above a top surface of the micro light-emitting diodes 130, or further cover on a top surface of the bank structure 140a1 away from the array substrate 110. Disposing of the protective layer around the micro light-emitting diodes 130 might leave some space in at least one of the accommodating regions C, or the protective layer might filled in at least one of the accommodating regions C, and is not limited thereto. The protective layer may also prevent the invasion of moisture and oxygen. A material of the protective layer comprises a transparent photoresist, a transparent ultraviolet gel, etc., and is not limited thereto. The bank structures 140a1 of the embodiment are disposed above the array substrate 110, and at least one of the bank structures 140a1 includes at least a first bank portion 142a1 and a second bank portion 144a1, wherein the first bank portion 142a1 and the second bank portion 144a1 are connected to each other. The second bank portion 144a1 is stacked on the first bank portion 142a1, and a width of at least one of the bank structures 140a1 gradually decreases from the first bank portion 142a1 to the second bank portion 144a1. That is to say, the width of the bank structures 140a1 of the embodiment can be different, and gradually decreases from the array substrate 110 to the opposite substrate 120. In other embodiments, the first bank portion 142a1 may be disposed above the array substrate 110, and the second bank portion 144a1 may be disposed above the opposite substrate 120. Alternatively, both the first bank portion 142a1 and the second bank portion 144a1 are disposed above the opposite substrate 120, and is not limited thereto. When preparing the display device 100a, the micro light-emitting diodes 130, the first bank portion 142a1, and the second bank portion 144a1 might be formed on the array substrate 110 with no specific disposing order.

Figure 1B:
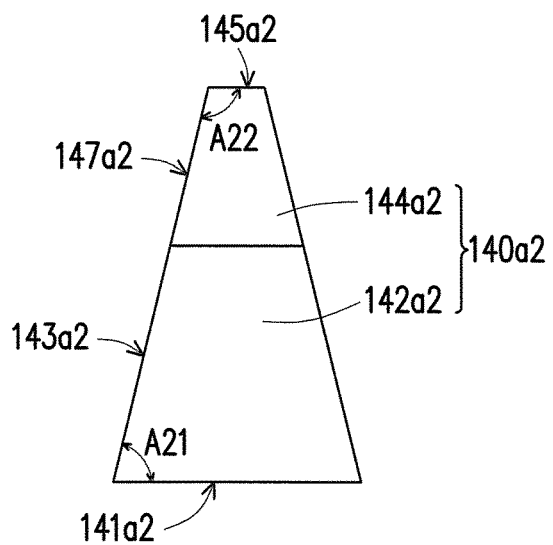
FIG. 1B is a schematic view of a bank structure of an embodiment of the display device of FIG. 1A.

More specifically, as shown in FIG. 1A, the first bank portion 142a1 has a first bottom surface 141a1 and a first side surface 143a1 connected to the first bottom surface 141a1, and a first included angle A11 is formed between the first side surface 143a1 and the first bottom surface 141a1. The first bottom surface 141a1 is a surface of the first bank portion 142a1 adjacent to the array substrate 110. The second bank portion 144a1 has a second bottom surface 145a1 and a second side surface 147a1 connected to the second bottom surface 145a1, the second bottom surface 145a1 is a surface of the second bank portion 144a1 away from the array substrate 110, and a second included angle A12 is formed between the second side surface 147a1 and the second bottom surface 145a1. In an embodiment, the first included angle A11 and the second included angle A12 are between 30 degrees and 150 degrees but not equal to 90 degrees respectively, for example. As shown in FIG. 1A, exterior contours of both the first bank portion 142a1 and the second bank portion 144a1 are trapezoids, and the first included angle A11 is different from the second included angle A12. For example, the first included angle A11 is less than the second included angle A12. In other embodiments, referring to FIG. 1B, a bank structure 140a2 includes at least a first bank portion 142a2 and a second bank portion 144a2. The first bank portion 142a2 has a first bottom surface 141a2 and a first side surface 143a2 connected to the first bottom surface 141a2, and a first included angle A21 is formed between the first side surface 143a2 and the first bottom surface 141a2. The second bank portion 144a2 has a second bottom surface 145a2 and a second side surface 147a2 connected to the second bottom surface 145a2, and a second included angle A22 is formed between the second side surface 147a2 and the second bottom surface 145a2. In an embodiment, the first included angle A21 may also be equal to the second included angle A22. In other embodiments, if the first bank portion 142a2 and the second bank portion 144a2 are formed by the same material, the bank structure 140a2 may also be an integrally formed structure (namely, there is no boundary between the first bank portion 142a2 and the second bank portion 144a2). A height of at least one the bank structure 140a2 may be more than or equal to the height of at least one of the micro light-emitting diodes 130, and is not limited thereto.

Figure 1C:
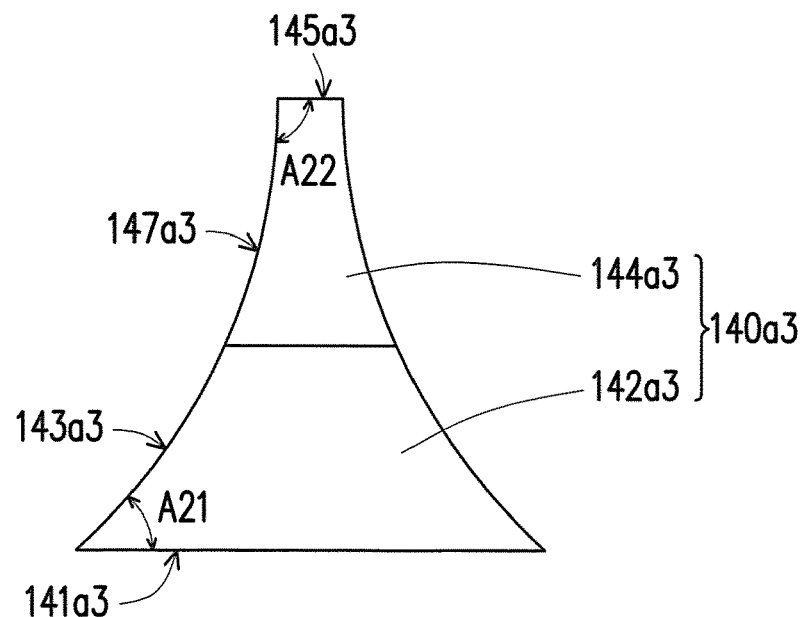
FIG. 1C is a schematic view of a bank structure of another embodiment of the display device of FIG. 1A.
Figure 1D:
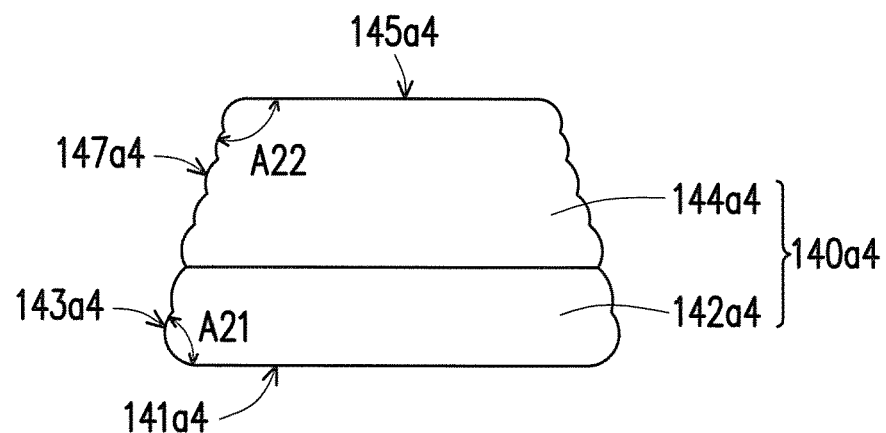
FIG. 1D is a schematic view of a bank structure of another embodiment of the display device of FIG. 1A.

It should be noted that, the exterior contours of the bank structures 140a1 and 140a2 are not limited by the embodiment, even though the first bank portions 142a1, 142a2 and the second bank portions 144a1, 144a2 depicted here are all regular trapezoids and have the first side surfaces 143a1, 143a2 and the second side surfaces 147a1, 147a2 respectively. However, in other embodiments, referring to FIG. 1C, a first bank portion 142a3 of a bank structure 140a3 has a first bottom surface 141a3 and a first curved surface 143a3 connected to the first bottom surface 141a3, and a second bank portion 144a3 has a second bottom surface 145a3 and a second curved surface 147a3 connected to the second bottom surface 145a3, wherein the first curved surface 143a3 and the second curved surface 147a3 are connected to each other. Alternatively, referring to FIG. 1D, a first bank portion 142a4 of a bank structure 140a4 has a first bottom surface 141a4 and a first concave-convex surface 143a4 connected to the first bottom surface 141a4, and a second bank portion 144a4 has a second bottom surface 145a4 and a second concave-convex surface 147a4 connected to the second bottom surface 145a4, wherein the first concave-convex surface 143a4 and the second concave-convex surface 147a4 are connected to each other. In short, outer surfaces of the bank structures 140a1, 140a2, 140a3 and 140a4 may be an inclined surface, a curved surface (or arc surface) or an irregular surface, and is not limited thereto.

It should be mentioned that, as shown in FIG. 1A, FIG. 1B, FIG. 1C and FIG. 1D, the first side surfaces 143a1, 143a2, 143a3 and 143a4 and the second side surfaces 147a1, 147a2, 147a3 and 147a4 have the same contour specifically. For example, they are all flat surfaces, curved surfaces or concave-convex surfaces. However, in other embodiments not shown, the first side surfaces and the second side surfaces may have different contours respectively. For example, the first side surface is a flat surface while the second side surface is a curved surface, and is not limited thereto. Additionally, the first included angles A11 and A21 and the second included angles A12 and A22 are between 30 degrees and 150 degrees but not equal to 90 degrees respectively, for example. Also, the first included angles A11, A21 and the second included angles A12, A22 may be the same or different, and is not limited thereto.

Additionally, a material of the first bank portions 142a1, 142a2, 142a3 and 142a4 and the second bank portions 144a1, 144a2, 144a3 and 144a4 of the bank structures 140a1, 140a2, 140a3 and 140a4 may be the same or different, which can be comprised of any patternable gel material, wherein the material comprises, for example, a black photoresist, a white photoresist, a transparent material doped with a scattering material, a transparent material coated with a reflective film, or a photo spacer. For instance, referring to FIG. 1A, if the first bank portion 142a1 comprises a black photoresist and the second bank portion 144a1 comprises a white photoresist, the first bank portion 142a1 can absorb the light with larger angle emitted from the micro light-emitting diodes 130 to the array substrate 110, so as to prevent the light with larger angle from generating a specific angle reflection after reflecting from the array substrate 110, thereby affecting visual effects. The second bank portions 144a1 can guide lights emitted from side walls of the micro light-emitting diodes 130 to be transmitted along a normal direction so as to improve the light-emitting efficiency of the micro light-emitting diodes 130 and adjust the light-emitting viewing angle of the micro light-emitting diodes 130.

In short, since the display device 100a of the embodiment comprises the bank structures 140a1, the optical cross-talk phenomenon generated by the micro light-emitting diodes 130 arranged in an array on the array substrate 110 can be effectively reduced. Thereby, the optical display performance of the display device 100a of the embodiment can be effectively improved. Additionally, the bank structures 140a1 are composed of the first bank portion 142a1 and the second bank portion 144a1 connected to each other, and thus the material of the first bank portion 142a1 and the second bank portion 144a1, the angle design of the first included angle A11 and the second included angle A12 and the position where the first bank portion 142a1 and the second bank portion 144a1 disposed can be chosen by users according to their needs. For example, the first bank portion 142a1 and the second bank portion 144a1 are both disposed above the array substrate 110 or the opposite substrate 120. Alternatively, at least one of the first bank portion 142a1 and the second bank portion 144a1 is disposed above the array substrate 110, and at least another one of the first bank portion 142a1 and the second bank portion 144a1 is disposed above the opposite substrate 120. In other words, the bank structures 140a1 of the embodiment has a wider flexibility of the design, and the micro light-emitting diodes 130 may have better light-emitting efficiency by the design of the bank structures 140a1, such that the display device 100a of the embodiment has a better optical display performance.

It should be noted that, the component notations and partial details of the structures hereinafter provided in the embodiments can be the same as or similar to the previous embodiment, wherein the same notations represent the same or similar components while the repeated same details are omitted, which can refer to the previous embodiment.

Figure 2:
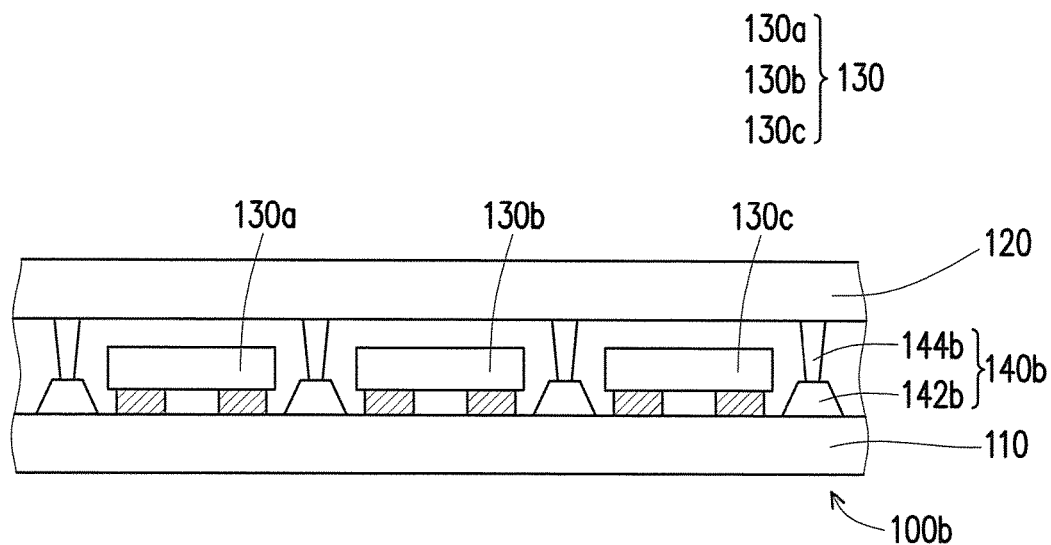
FIG. 2 is a schematic cross-sectional view of a display device according to another embodiment.

FIG. 2 is a schematic cross-sectional view of a display device according to another embodiment. Referring to FIG. 2, a display device 100b of the embodiment is similar to the display device 100a of FIG. 1A, and the difference therebetween is that, at least one of bank structures 140b of the embodiment includes at least a first bank portion 142b and a second bank portion 144b, wherein the first bank portion 142b is disposed above the array substrate 110, and the second bank portion 144b is disposed above the opposite substrate 120. The first bank portion 142b and the second bank portion 144b are connected to each other. A width of the first bank portion 142b gradually decreases from the array substrate 110 to the opposite substrate 120, and a width of the second bank portion 144b gradually decreases from the opposite substrate 120 to the array substrate 110. Also, after the combination of the array substrate 110 and the opposite substrate 120, the first bank portion 142b is connected to the second bank portion 144b. Thus, the optical cross-talk phenomenon generated by the micro light-emitting diodes 130 can be significantly reduced, so as to effectively improve the optical display performance of the display device 100b of the embodiment.

Figure 3:
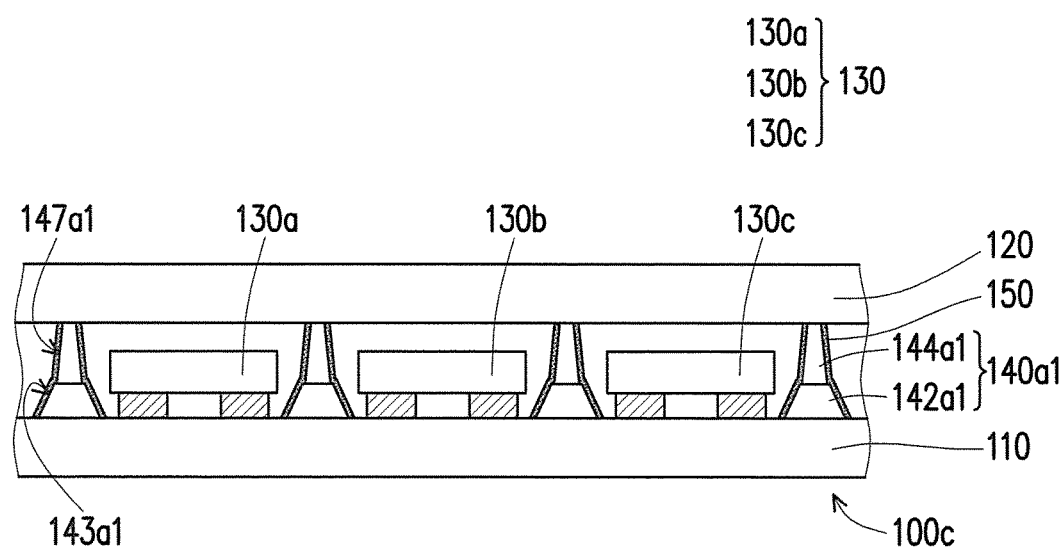
FIG. 3 is a schematic cross-sectional view of a display device according to another embodiment.

FIG. 3 is a schematic cross-sectional view of a display device according to another embodiment. Referring to FIG. 3, a display device 100c of the embodiment is similar to the display device 100a of FIG. 1A, and the difference therebetween is that, the display device 100c of the embodiment further includes an optical coating layer 150 disposed above an outer surface of at least one of the bank structures 140a1. As shown in FIG. 3, the optical coating layer 150 covers the first side surface 143a1 of the first bank portion 142a1 and the second side surface 147a1 of the second bank portion 144a1. If the optical coating layer 150 comprises a reflective material (e.g., silver, aluminum or chromium, and is not limited thereto), the light-emitting efficiency of the micro light-emitting diodes 130 can be effectively increased. However, if the optical coating layer 150 comprises a light absorbing material (e.g., chromium, chromium nitride, chromium oxide, aluminum alloy or aluminum nitride, and is not limited thereto), stray light can be effectively reduced. In other embodiments, the optical coating layer 150 may also cover on a portion of the outer surface of at least one of the bank structures 140a1, and is not limited thereto.

Figure 4:
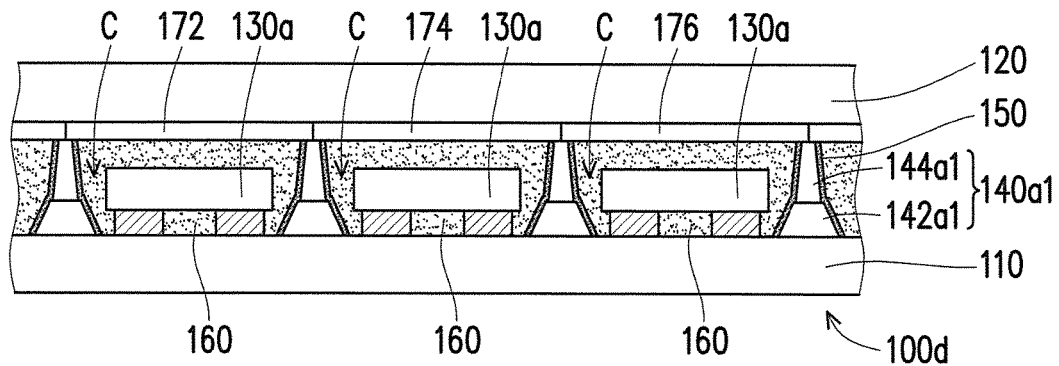
FIG. 4 is a schematic cross-sectional view of a display device according to another embodiment.

FIG. 4 is a schematic cross-sectional view of a display device according to another embodiment. Referring to FIG. 4, a display device 100d of the embodiment is similar to the display device 100c of FIG. 3, and the difference therebetween is that, the micro light-emitting diodes of the embodiment can emit light with the same color, such as blue light micro light-emitting diodes 130a. Furthermore, the display device 100d of the embodiment further includes a wavelength converting material 160 and a plurality of color filter patterns 172, 174 and 176. The wavelength converting material 160 is disposed in at least one of the accommodating regions C, and covers at least the blue light micro light-emitting diodes 130a, wherein the wavelength converting material 160 comprises phosphors or quantum dots (QD), for example. Specifically, the wavelength converting material 160 might be composed of the phosphors or the quantum dots dispersed in a matrix, or the wavelength converting material 160 might be composed of only the phosphors or the quantum dots without a matrix, and is not limited thereto. The phosphors may be yellow phosphors, a mixture of green phosphors and red phosphors, or a green phosphor layer stacked with a red phosphor layer, and is not limited thereto. The quantum dots may be yellow quantum dots, a mixture of green quantum dots and red quantum dots, or a green quantum dot layer stacked with a red quantum dot layer, and is not limited thereto. The color filter patterns 172, 174 and 176 are disposed above the opposite substrate 120 and have at least two different colors, such as blue, green or red, wherein at least one of the color filter patterns 172, 174 and 176 may also be transparent, and is not limited thereto. That is to say, the display device 100d of the embodiment is the use of the blue light micro light-emitting diodes 130a with the blue color filter pattern 172, the green color filter pattern 174 and the red color filter pattern 176 to achieve full-color display effects. The blue color filter pattern 172 of the embodiment may be a color filter pattern which exhibits blue color, or may be a transparent material. Additionally, since the optical coating layer 150 (herein, a reflective material) covering the outer surface of the bank structures 140a1 can increase the light path of blue light emitted from the blue light micro light-emitting diodes 130a in the wavelength converting material 160, the conversion efficiency of blue light can be increased. Also, the combination of the optical coating layer 150 and the wavelength converting material 160 can prevent lateral light of the blue light micro light-emitting diodes 130a from absorbing to reduce an amount of emitted-light of the blue light micro light-emitting diodes 130a. In short, the display device 100d of the embodiment may have a better optical display performance.

Figure 5:
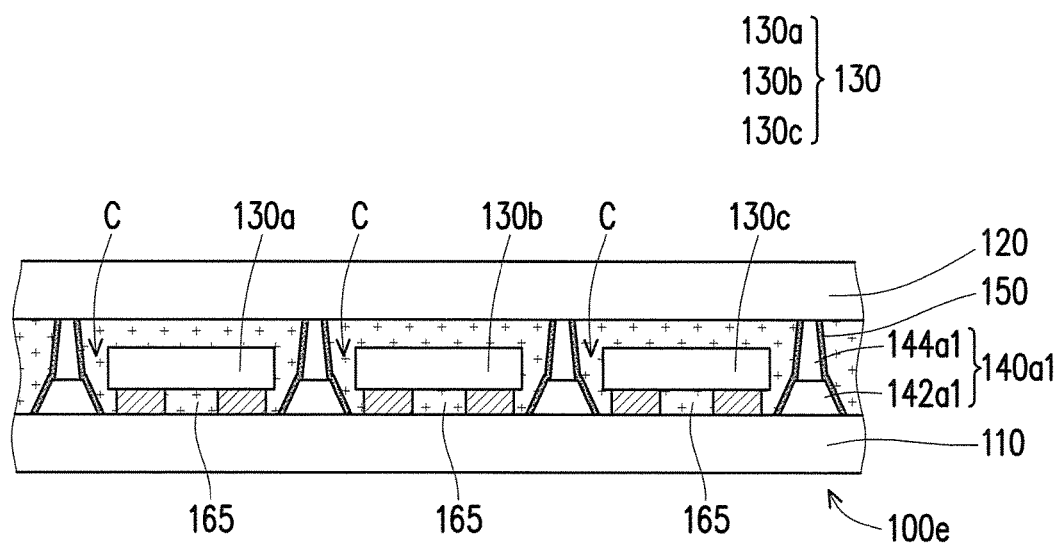
FIG. 5 is a schematic cross-sectional view of a display device according to another embodiment.

FIG. 5 is a schematic cross-sectional view of a display device according to another embodiment. Referring to FIG. 5, a display device 100e of the embodiment is similar to the display device 100c of FIG. 3, and the difference therebetween is that, the display device 100e of the embodiment further includes a scattering material 165 disposed in at least one of the accommodating regions C and covering at least the micro light-emitting diodes 130. Here, the scattering material 165 comprises titanium dioxide, for example, and the purpose thereof is to adjust the light shape (light-emitting angle) of the micro light-emitting diodes 130, or to increase the light-emitting angle of the micro light-emitting diodes 130.

Figure 6:
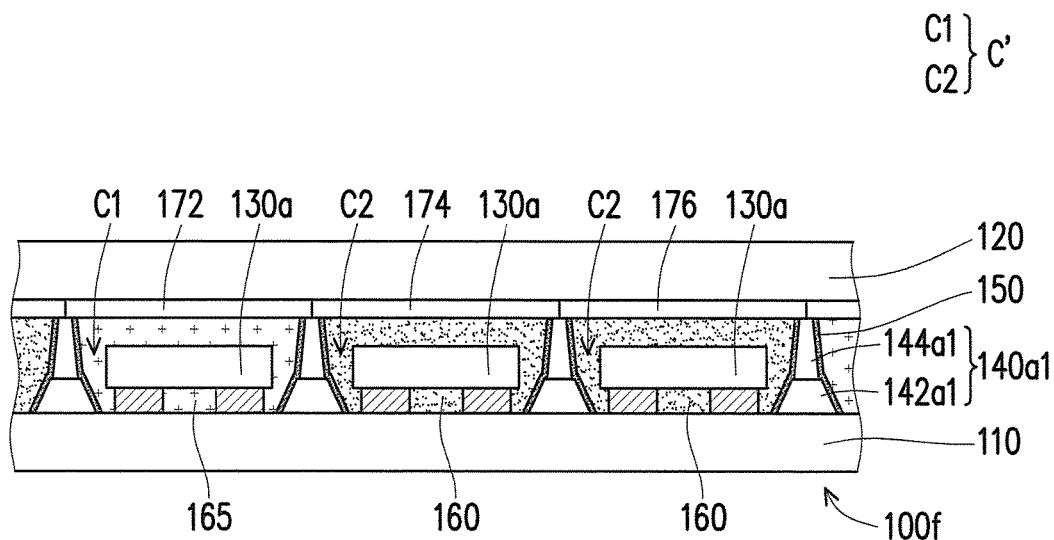
FIG. 6 is a schematic cross-sectional view of a display device according to another embodiment.

FIG. 6 is a schematic cross-sectional view of a display device according to another embodiment. Referring to FIG. 6, a display device 100f of the embodiment is similar to the display device 100c of FIG. 3, and the difference therebetween is that, the micro light-emitting diodes of the embodiment can emit light with the same color, such as the blue light micro light-emitting diodes 130a. Furthermore, accommodating regions C' of the embodiment include a plurality of first accommodating regions C1 and a plurality of second accommodating regions C2. The display device 100f further includes the plurality of color filter patterns 172, 174 and 176, the scattering material 165 and the wavelength converting material 160. The color filter patterns 172, 174 and 176 are disposed above the opposite substrate 120 and have at least two different colors, such as blue, green or red. It may also be transparent. For instance, the color filter pattern 172 of the embodiment may be a color filter pattern which exhibits blue color, or may be a transparent material. The scattering material 165 is disposed in the first accommodating regions C1, and the wavelength converting material 160 is disposed in the second accommodating regions C2, wherein the scattering material 165 and the wavelength converting material 160 cover the blue light micro light-emitting diodes 130a. Here, the purpose of the scattering material 165 is to adjust the light shape (light-emitting angle) of the blue light micro light-emitting diodes 130a, or to increase the light-emitting angle of the blue light micro light-emitting diodes 130a. The wavelength converting material 160 comprises phosphors or quantum dots, for example. Blue light emitted from the blue light micro light-emitting diodes 130a may enable the display device 100f to have a high color saturation performance by the wavelength converting material 160 and the color filter patterns 174 and 176 with different colors (e.g., green and red).

Figure 7:
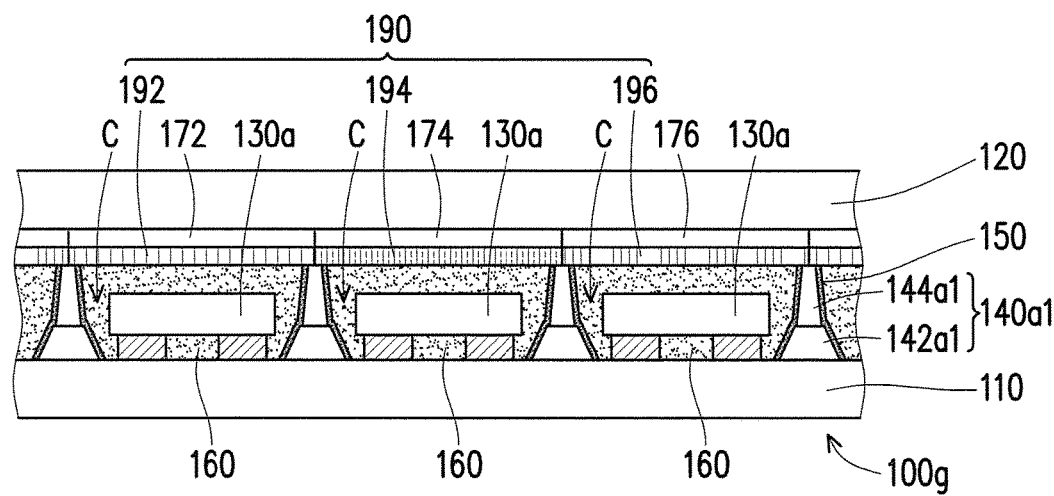
FIG. 7 is a schematic cross-sectional view of a display device according to another embodiment.

FIG. 7 is a schematic cross-sectional view of a display device according to another embodiment. Referring to FIG. 7, a display device 100g of the embodiment is similar to the display device 100d of FIG. 4, and the difference therebetween is that, the display device 100g of the embodiment further includes a filter pattern layer 190 disposed above the opposite substrate 120 and having a plurality of filter patterns 192, 194 and 196, wherein the filter patterns 192, 194 and 196 are disposed corresponding to the color filter patterns 172, 174 and 176 respectively. Specifically, the filter pattern 192 is disposed between the blue color filter pattern 172 and the blue light micro light-emitting diodes 130a, the filter pattern 194 is disposed between the green color filter pattern 174 and the blue light micro light-emitting diodes 130a, and the filter pattern 196 is disposed between the red color filter pattern 176 and the blue light micro light-emitting diodes 130a. The color filter pattern 172 is disposed between the filter pattern 192 and the opposite substrate 120, the color filter pattern 174 is disposed between the filter pattern 194 and the opposite substrate 120, and the color filter pattern 176 is disposed between the filter pattern 196 and the opposite substrate 120. The filter patterns of the embodiment may be band pass filters. Specifically, the filter patterns 192, 194 and 196 allow light in a specific wavelength range to pass, and light in other non-specific wavelength range will be reflected. For instance, the filter pattern 192 allows blue light to penetrate, the filter pattern 194 allows green light to penetrate, and the filter pattern 196 allows red light to penetrate. When light in a specific wavelength range passes the filter patterns 192, 194 and 196, and light in non-specific wavelength range is reflected back to the wavelength converting material 160, reflected light will excite the wavelength converting material 160 again such that excitation light will pass the filter patterns 192, 194 and 196 again. Thereby, light conversion ratio of the blue light micro light-emitting diodes 130a can be improved, and the required thickness of the wavelength converting material 160 can be reduced. In other embodiments, the filter patterns 192, 194 and 196 may also be high pass filters or low pass filters, and is not limited thereto.

Figure 8A:
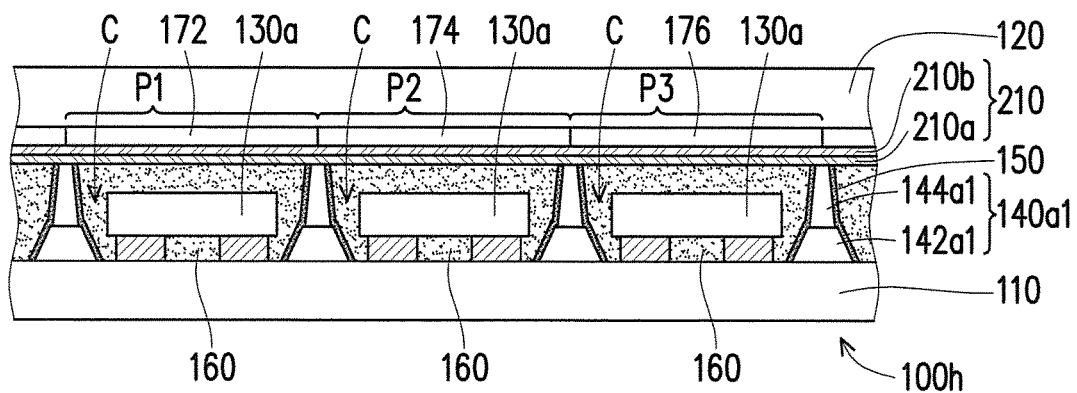
FIG. 8A is a schematic cross-sectional view of a display device according to another embodiment.
Figure 8B:
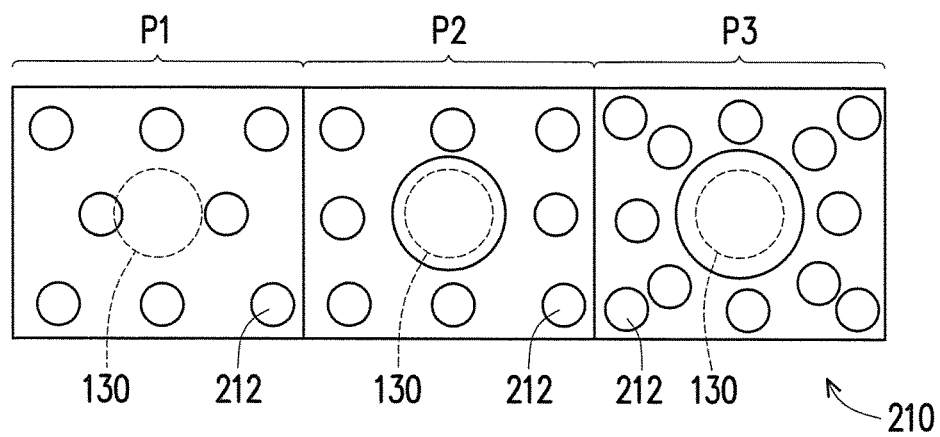
FIG. 8B is a schematic top view of a patterned reflective layer of FIG. 8A.

FIG. 8A is a schematic cross-sectional view of a display device according to another embodiment. FIG. 8B is a schematic top view of a patterned reflective layer of FIG. 8A. Referring to FIG. 8A and FIG. 8B at the same time, a display device 100h of the embodiment is similar to the display device 100d of FIG. 4, and the difference therebetween is that, the display device 100h of the embodiment further includes a patterned reflective layer 210 disposed above the opposite substrate 120 and having a plurality of reflective patterns 212, wherein the color filter patterns 172, 174 and 176 are located between the patterned reflective layer 210 and the opposite substrate 120. A distribution density of the reflective patterns 212 changes with the color filter patterns 172, 174 and 176 corresponding to different colors. More specifically, the blue color filter pattern 172, the green color filter pattern 174 and the red color filter pattern 176 are located in a first sub-pixel region P1, a second sub-pixel region P2 and a third sub-pixel region P3 respectively. The reflective patterns 212 reflect the blue light emitted from the blue light micro light-emitting diodes 130a back to the at least one of the accommodating regions C, and the blue light will further be reflected towards the patterned reflective layer 210. Regions around the reflective patterns 212 allow the blue light emitted from the blue light micro light-emitting diodes 130a to pass through the patterned reflective layer 210. The distribution density of the reflective pattern 212 located in the third sub-pixel region P3 is more than the distribution density of the reflective pattern 212 located in the second sub-pixel region P2, and the distribution density of the reflective pattern 212 located in the second sub-pixel region P2 is more than the distribution density of the reflective pattern 212 located in the first sub-pixel region P1. That is to say, the distribution density of the reflective pattern 212 gradually increases from the blue color filter pattern 172 to the green color filter pattern 174 and the red color filter pattern 176. That is, blue light emitted from the blue light micro light-emitting diodes 130a has different light paths in different sub-pixel regions by the distribution density of the reflective pattern 212, thereby improving the optical display performance of the display device 100h.

Additionally, referring to FIG. 8A, the patterned reflective layer 210 of the embodiment specifically includes a first patterned reflective layer 210a and a second patterned reflective layer 210b. The second patterned reflective layer 210b is located between the first patterned reflective layer 210a and the color filter patterns 172, 174 and 176. A material of the first patterned reflective layer 210a comprises a metal material having a reflectivity more than 70%, such as silver, aluminum or chromium, and a material of the second patterned reflective layer 210b comprises a light absorbing material, such as chromium oxide, chromium nitride, aluminum oxide or aluminum nitride, and is not limited thereto. That is to say, the patterned reflective layer 210 of the embodiment is composed of a structural layer stacked by a plurality of layers. However, in other embodiments not shown, the patterned reflective layer may also be a single-layer structural layer, and the material thereof comprises, for example, a high reflectivity material of silver layers or aluminum layers, which is still within the scope of the embodiment. Here, the purpose of the first patterned reflective layer 210a is to enable the blue light micro light-emitting diodes 130a to be reflected so as to excite the wavelength converting material 160 again, and the purpose of the second patterned reflective layer 210b is to prevent the first patterned reflective layer 210a from irradiating by external light directly which may cause a reduction of contrast.

Figure 9A:
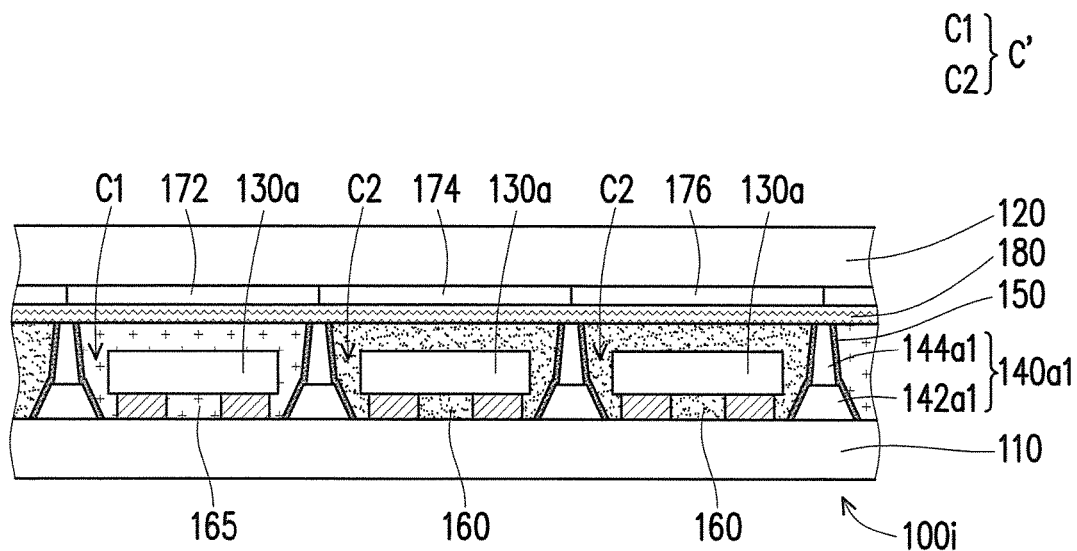
FIG. 9A is a schematic cross-sectional view of a display device according to another embodiment.

FIG. 9A is a schematic cross-sectional view of a display device according to another embodiment. Referring to FIG. 9A, a display device 100i of the embodiment is similar to the display device 100f of FIG. 6, and the difference therebetween is that, the display device 100i of the embodiment further includes a wavelength converting enhancement layer 180 disposed between the color filter patterns 174 and 176 and the wavelength converting material 160, and between the color filter pattern 172 and the scattering material 165, which can effectively improve light conversion ratio of light emitted from the blue light micro light-emitting diodes 130a.

Figure 9B:
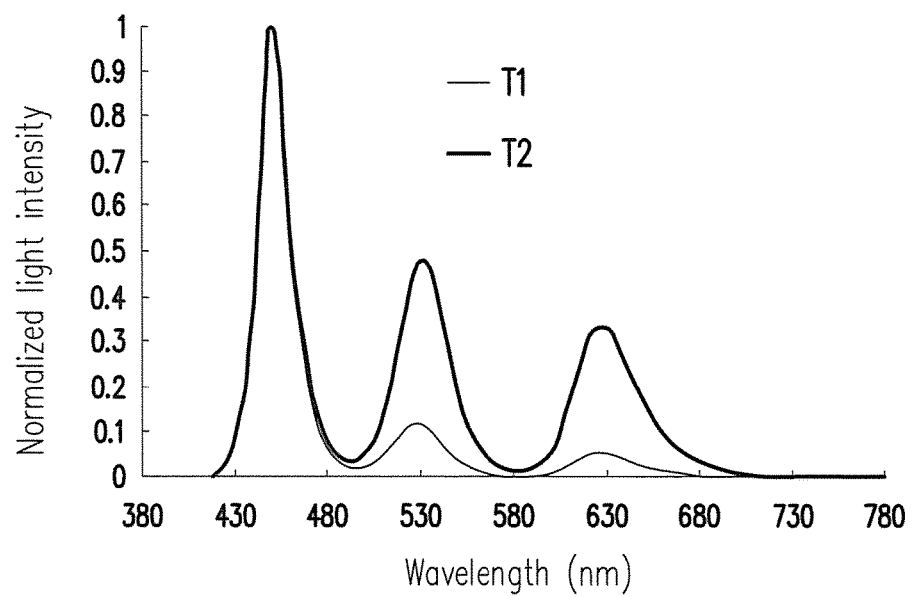
FIG. 9B is a curve diagram illustrating a relationship between wavelength and normalized light intensity of the display device with the wavelength converting enhancement layer and without the wavelength enhancement converting layer of FIG. 9A.

FIG. 9B is a curve diagram illustrating a relationship between wavelength and normalized light intensity of the display device with the wavelength converting enhancement layer 180 and without the wavelength enhancement converting layer 180 of FIG. 9A. The curve T1 represents the display device not provided with the wavelength converting enhancement layer 180; while the curve T2 represents the display device 100*i* provided with the wavelength converting enhancement layer 180. The curve T1 and the curve T2 is a compared spectrogram which have been normalized with blue light peak (wavelength of about 430 nm to 480 nm). As shown in FIG. 9B, the display device 100*i* with the wavelength converting enhancement layer 180 can effectively improve the light conversion efficiency of light emitted from the blue light micro light-emitting diodes 130*a* compared with the display device provided without the wavelength converting enhancement layer 180.

Figure 9C:
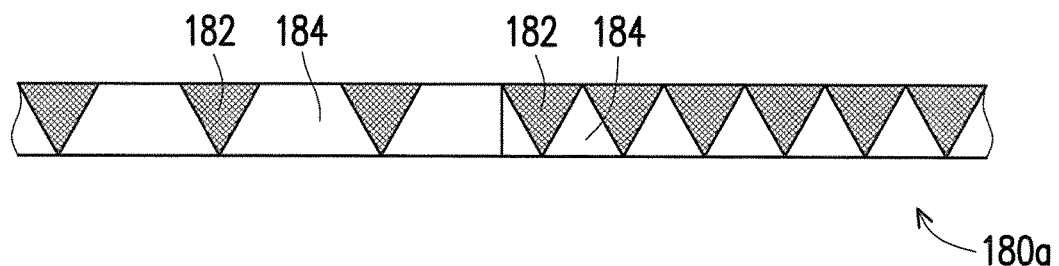
FIG. 9C and FIG. 9D are schematic views of the wavelength converting enhancement layers according to two different embodiments in FIG. 9A.
Figure 9D:
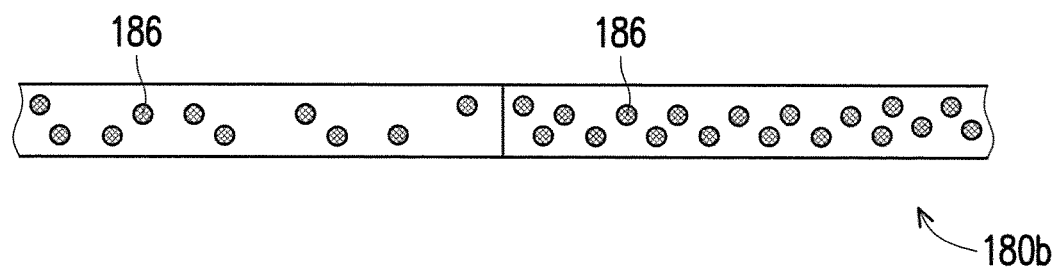

It should be noted that, the wavelength converting enhancement layer 180 of the embodiment may be the filter pattern layer 190 in FIG. 7 or the patterned reflective layer 210 in FIG. 8A and FIG. 8B, for example. Definitely, the wavelength converting enhancement layer 180 of the embodiment may also be a microstructural layer 180*a* comprised of a plurality of high reflectivity patterns 182 and a plurality of low reflectivity patterns 184 in FIG. 9C, wherein the light reflection path of the corresponding region can be changed by the setting density of the high reflectivity patterns 182 and the low reflectivity patterns 184. Specifically, since the high reflectivity patterns 182 is more likely to reflect light than the low reflectivity patterns 184 in the microstructural layer 180*a*. The microstructural layer 180*a* is similar to the patterned reflective layer 210 in FIG. 8A, which can enable light emitted from the micro light-emitting diode to have different light paths in different sub-pixel regions by the distribution density of the high reflectivity patterns 182, thereby improving the optical display performance of the display device. Alternatively, the wavelength converting enhancement layer 180 of the embodiment may also be a microstructural layer 180*b* doped with scattering particles 186 in FIG. 9D, wherein the light reflection path of the corresponding region can be changed by the distribution density of the scattering particles 186. Specifically, light will be scattered when meets the scattering particles 186, and thus the microstructural layer 180*b* enables light emitted from the micro light-emitting diode to have different light paths in different sub-pixel regions by the distribution density of the scattering particles 186, thereby improving the optical display performance of the display device, wherein the scattering particles 186 comprise titanium dioxide, for example.

Figure 10:
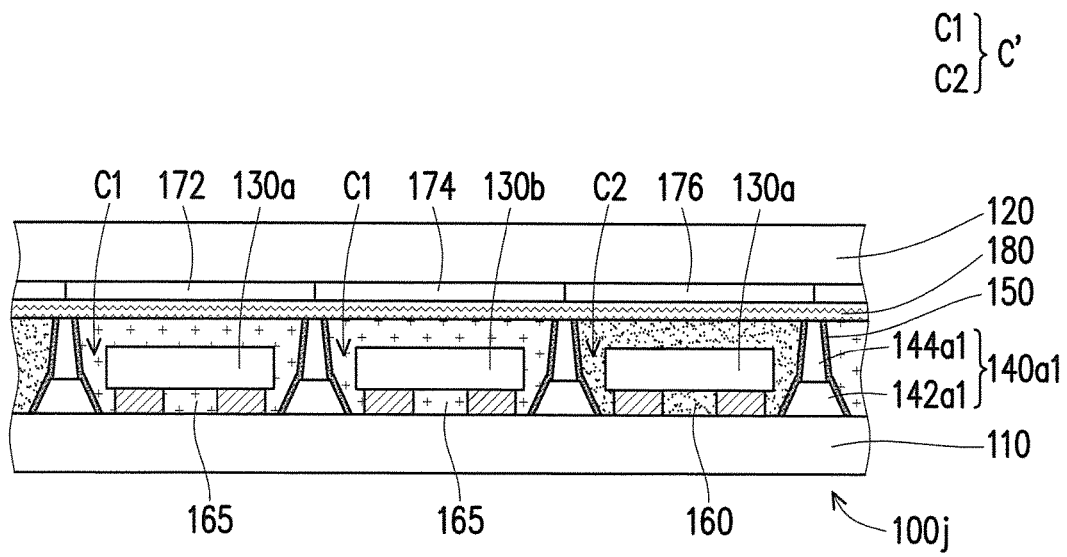
FIG. 10 is a schematic cross-sectional view of a display device according to another embodiment.

FIG. 10 is a schematic cross-sectional view of a display device according to another embodiment. Referring to FIG. 10, a display device 100*j* of the embodiment is similar to the display device 100*i* of FIG. 9A, and the difference therebetween is that, the micro light-emitting diodes of the embodiment can emit light with different colors specifically, such as the blue light micro light-emitting diodes 130*a* and the green light micro light-emitting diodes 130*b*, wherein the green light micro light-emitting diodes 130*b* are located between the blue light micro light-emitting diodes 130*a*. As shown in FIG. 10, the second accommodating regions C2 corresponding to the red color filter pattern 176 are disposed with the wavelength converting material 160, while the first accommodating regions C1 corresponding to the blue color filter pattern 172 and corresponding to the green color filter pattern 174 are disposed with the scattering material 165. In the embodiment, the color filter pattern 172 corresponding to blue and the color filter pattern 174 corresponding to green may be color filter patterns having color (e.g., blue and green), and may also be a transparent material.

Figure 11:
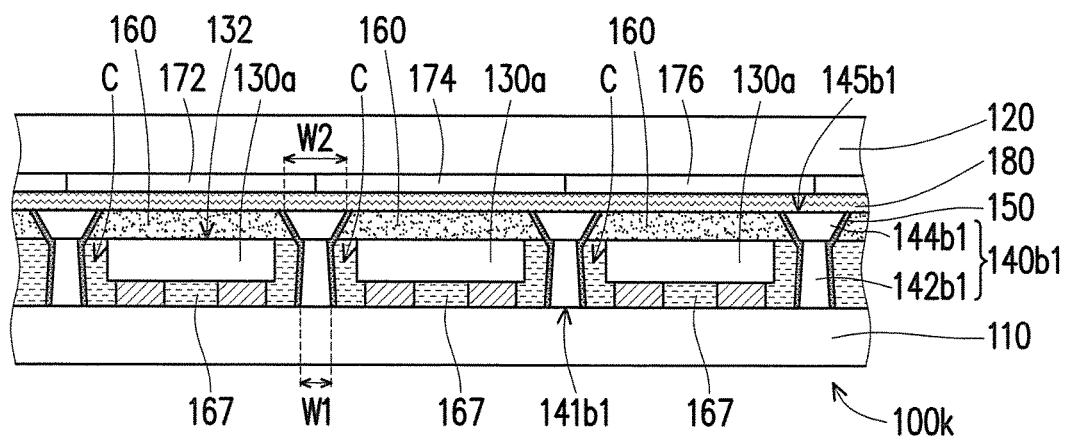
FIG. 11 is a schematic cross-sectional view of a display device according to another embodiment.

FIG. 11 is a schematic cross-sectional view of a display device according to another embodiment. Referring to FIG. 11, a display device 100*k* of the embodiment is similar to the display device 100*b* of FIG. 2, and the difference therebetween is that, the micro light-emitting diodes of the embodiment can emit light with the same color specifically, such as the blue light micro light-emitting diodes 130*a*. A first bank portion 142*b*1 disposed above the array substrate 110 of the embodiment has a first bottom surface 141*b*1 relatively far away from the opposite substrate 120, and a second bank portion 144*b*1 disposed above the opposite substrate 120 has a second bottom surface 145*b*1 relatively far away from the array substrate 110, wherein a width W1 of the first bottom surface 141*b* is less than a width W2 of the second bottom surface 145*b*1, and is not limited thereto. In other embodiments not shown, the width W1 of the first bottom surface 141*b*1 may also be more than or equal to the width W2 of the second bottom surface 145*b*1. As shown in FIG. 11, a width of the first bank portion 142*b*1 gradually decreases from the array substrate 110 to the opposite substrate 120, and a width of the second bank portion 144*b*1 gradually decreases from the opposite substrate 120 to the array substrate 110. Thus, a necking portion is formed at the junction of the first bank portion 142*b*1 and the second bank portion 144*b*1. In other embodiment, a discontinuous interface is formed at the necking portion of the first bank portion 142*b*1 and the second bank portion 144*b*1, and is not limited thereto.

Furthermore, the display device 100*k* of the embodiment further includes a filler material 167, the wavelength converting material 160, the plurality of color filter patterns 172, 174 and 176 and the wavelength converting enhancement layer 180. The filler material 167 is disposed in at least one of the accommodating regions C around at least one of the blue light micro light-emitting diodes 130*a*, and exposing an upper surface 132 of at least one of the blue light micro light-emitting diodes 130*a* relatively far away from the array substrate 110. The wavelength converting material 160 is disposed in at least one of the accommodating regions C, and covers at least the filler material 167 and the upper surface 132 of at least one of the blue light micro light-emitting diodes 130*a*. The color filter patterns 172, 174 and 176 are disposed above the opposite substrate 120 and have at least two different colors, such as blue light, green light or red light. It may also be transparent. The wavelength converting enhancement layer 180 is disposed between the color filter patterns 172, 174 and 176 and the wavelength converting material 160. Here, the wavelength converting enhancement layer 180 is the filter pattern layer 190 in FIG. 7, the patterned reflective layer 210 in FIG. 8A and FIG. 8B, the microstructural layer 180*a* in FIG. 9C, or the microstructural layer 180*b* in FIG. 9D. A material of the wavelength converting enhancement layer 180 comprises titanium dioxide or silicon dioxide, for example, and is not limited thereto.

Since bank structures 140*b*1 of the embodiment are composed of the first bank portion 142*b*1 and the second bank portion 144*b*1, wherein the design of the necking is formed between the first bank portion 142*b*1 and the second bank portion 144*b*1, re-reflection probability of light emitted from the blue light micro light-emitting diodes 130*a* can be effectively increased, thereby effectively improving the optical display performance of the overall display device 100*k*.

Additionally, the filler material 167 of the embodiment is a scattering material or a light absorbing material, for example, and the purpose thereof is to protect the surroundings of the blue light micro light-emitting diodes 130a. The wavelength converting material 160 is phosphors or quantum dots, for example.

Figure 12:
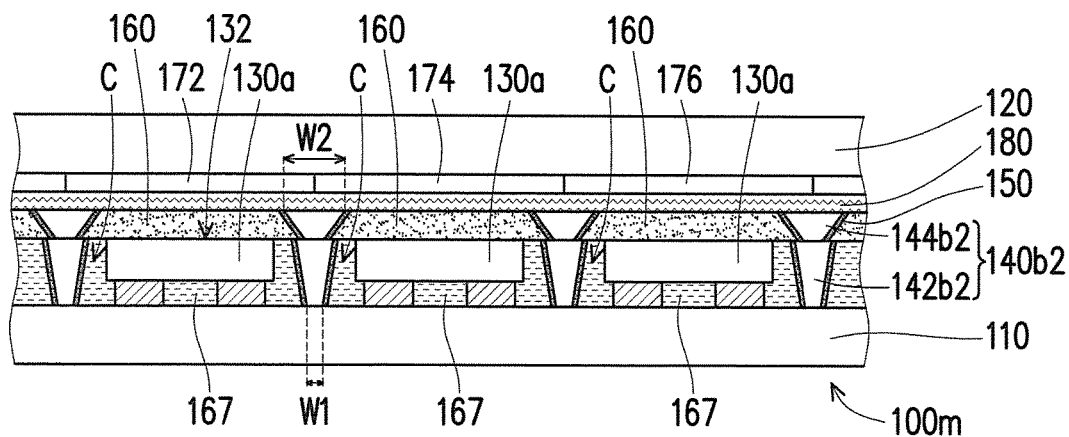
FIG. 12 is a schematic cross-sectional view of a display device according to another embodiment.

FIG. 12 is a schematic cross-sectional view of a display device according to another embodiment. Referring to FIG. 12, a display device 100m of the embodiment is similar to the display device 100k of FIG. 11, and the difference therebetween is that, a width of a first bank portion 142b2 of bank structures 140b2 of the embodiment gradually increases from the array substrate 110 to the opposite substrate 120, and a width of a second bank portion 144b2 gradually decreases from the opposite substrate 120 to the array substrate 110. Thus, a discontinuous interface is formed at the junction of the first bank portion 142b2 and the second bank portion 144b2.

Figure 13:
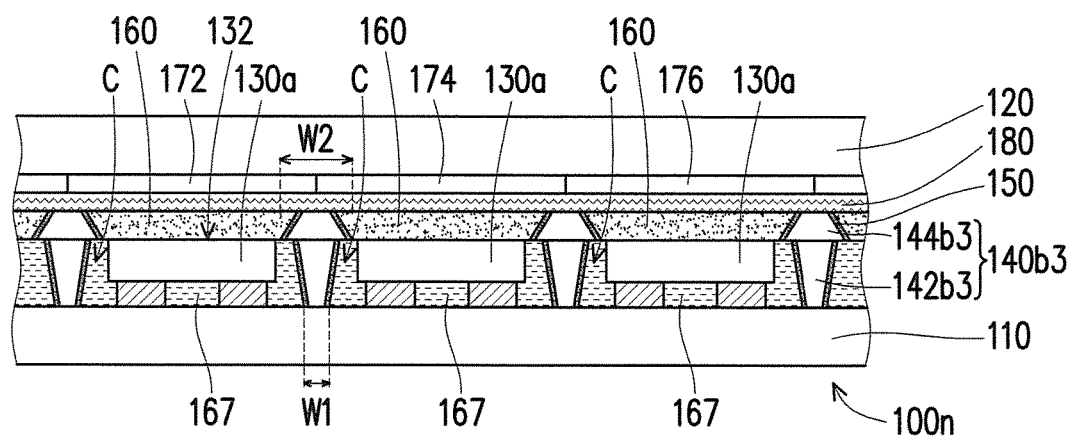
FIG. 13 is a schematic cross-sectional view of a display device according to another embodiment.

FIG. 13 is a schematic cross-sectional view of a display device according to another embodiment. Referring to FIG. 13, a display device 100n of the embodiment is similar to the display device 100k of FIG. 11, and the difference therebetween is that, a width of a first bank portion 142b3 of bank structures 140b3 of the embodiment gradually increases from the array substrate 110 to the opposite substrate 120, and a width of a second bank portion 144b3 gradually increases from the opposite substrate 120 to the array substrate 110. Thus, a discontinuous interface is formed at the junction of the first bank portion 142b3 and the second bank portion 144b3.

It should be mentioned that, although the optical coating layer 150 is depicted in the embodiments of FIG. 3 to FIG. 13, the display device may not have the optical coating layer in other embodiments not shown. That is to say, the optical coating layer is a selective element layer, not an essential element layer.

Figure 14:
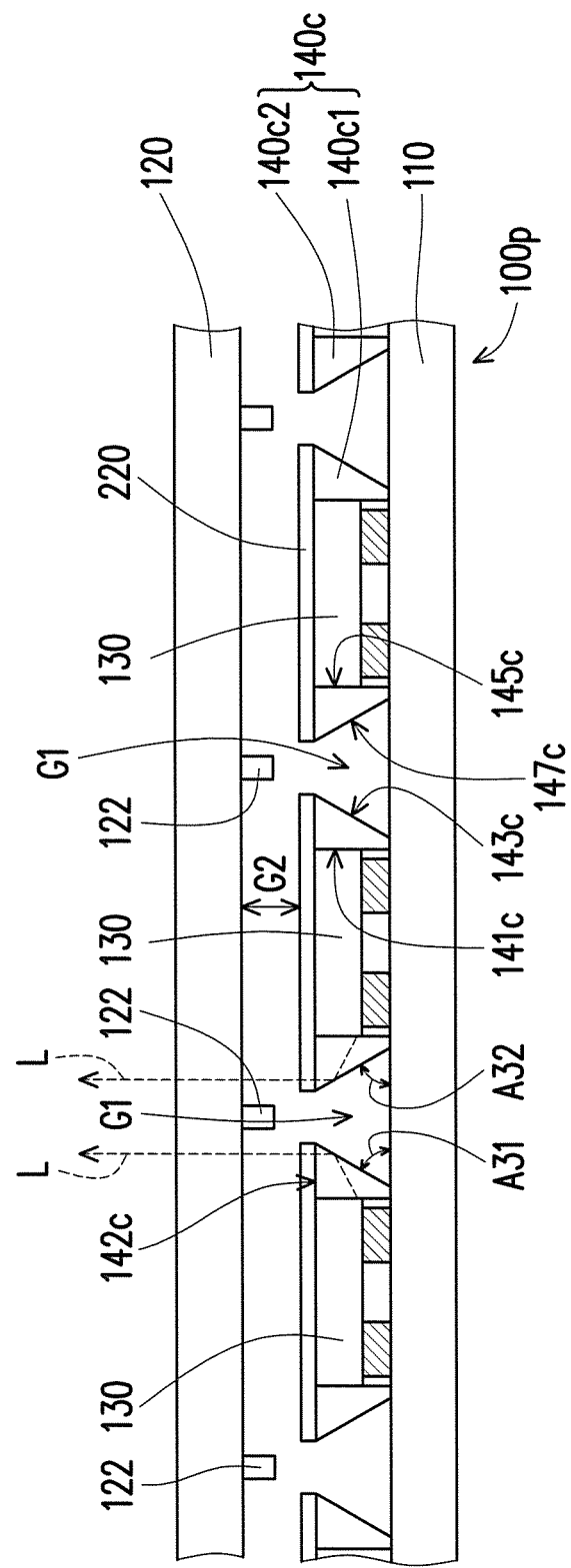
FIG. 14 is a schematic cross-sectional view of a display device according to another embodiment.

FIG. 14 is a schematic cross-sectional view of a display device according to another embodiment. Referring to FIG. 14, a display device 100p of the embodiment is similar to the display device 100a of FIG. 1A, and the difference therebetween is that, at least one of bank structures 140c includes a first bank structure 140c1 and a second bank structure 140c2. The first bank structure 140c1 and the second bank structure 140c2 are disposed above the array substrate 110, and the first bank structure 140c1 and the second bank structure 140c2 have a first air gap G1 therebetween. Furthermore, the bank structures 140c and the opposite substrate 120 have a second air gap G2 therebetween. The opposite substrate 120 includes a plurality of light absorbing patterns 122, and the light absorbing patterns 122 are located in the second air gap G2.

Specifically, the first bank structure 140c1 has a first flat surface 141c and a first inclined surface 143c opposite to each other. The second bank structure 140c2 has a second flat surface 145c and a second inclined surface 147c opposite to each other. The first inclined surface 143c faces the second inclined surface 147c. The first bank structure 140c1 and the second bank structure 140c2 have the first air gap G1 therebetween, and at least one of the light absorbing patterns 122 is disposed corresponding to at least one the first air gap G1. A width of the first bank structure 140c1 and a width of the second bank structure 140c2 gradually increase from the array substrate 110 to the opposite substrate 120. More specifically, the first inclined surface 143c and the array substrate 110 have a first included angle A31 therebetween, and the second inclined surface 147c and the array substrate 110 have a second included angle A32 therebetween. It should be noted that, the included angle A31 and the included angle A32 represent the angles outside the first bank structures 140c1 as shown in FIG. 14. The first included angle A31 is equal to the second included angle A32. In an embodiment, the first included angle is more than or equal to 30 degrees and less than 90 degrees. In other embodiments, the first included angle A31 may not be equal to the second included angle A32, and is not limited thereto.

Additionally, the display device 100p of the embodiment further includes a protective layer 220 disposed above the micro light-emitting diodes 130 and a top surface 142c of the bank structures 140c relatively far away from the array substrate 110, which can effectively protect the micro light-emitting diodes 130 from the invasion of moisture and oxygen. Here, a material of the protective layer 220 includes an organic material, an inorganic material or a combination of an organic material and an inorganic material. As shown in FIG. 14, the protective layer 220 of the embodiment is a single-layer structural layer specifically. However, in other embodiments not shown, the protective layer 220 may also be a multi-layer structural layer, such as a stacked layer of silicon oxide or aluminum oxide and silicon nitride, or a stacked layer of an inorganic material and an organic material; however, it is not limited thereto.

Since the first bank structure 140c1 and the second bank structure 140c2 of the embodiment have the first air gap G1 therebetween, lights emitted from side walls of the micro light-emitting diodes 130 can be totally reflected by the structure design of the first bank structure 140c1 and the second bank structure 140c2, such as light beam L. Thus, a higher portion of lights emitted from the side walls of the micro light-emitting diodes 130 can be guided to be emitted along a normal direction by total reflection. The light-emitting efficiency can be increased, and the optical cross-talk effects can be reduced.

It should be noted that, in other embodiments not shown, the bank structures 140a1, 140a2, 140a3, 140a4, 140b, 140b1, 140b2, 140b3 and 140c, the opposite substrate 120, the optical coating layer 150, the wavelength converting material 160, the scattering material 165, the filler material 167, the color filter patterns 172, 174 and 176, the filter patterns 192, 194 and 196, the patterned reflective layer 210, the microstructural layers 180a and 180b and the protective layer 220 mentioned in the embodiments can also be selected. The opposite substrate 120 might comprise a plurality of black matrix between different filter patterns or different color filter patterns to decrease an optical cross-talk phenomenon, and is not limited thereto. In other embodiments, the micro light-emitting diodes can be replaced entirely or partially by organic light-emitting diodes (OLED), liquid crystal (LC), quantum dot (QD) or other display elements, and is not limited thereto. The display device might also be a flexible display, a touch display, or a curved display, and is not limited thereto. The aforesaid components could be selected and combined according to the actual requirements in order to achieve the desirable technical effects.

In summary, since the display device of the embodiment has the design of the bank structures, the optical cross-talk phenomenon generated by the micro light-emitting diodes arranged in an array on the array substrate can be effectively reduced. Thereby, the optical display performance of the display device of the embodiment can be effectively improved.

Although the embodiment has been described, the modifications may be made without departing from the spirit of the embodiment. Accordingly, the scope of the embodiment is defined by the attached claims not by the above detailed descriptions.

What is claimed is:

1. A display device, comprising:
an array substrate;
a plurality of micro light-emitting diodes arranged in an array on the array substrate;
a plurality of bank structures located on the array substrate, wherein the plurality of micro light-emitting diodes are electrically connected to the array substrate, the plurality of bank structures form a plurality of accommodating regions, one of the plurality of micro light-emitting diodes is located in one of the plurality of accommodating regions, one of the plurality of bank structures comprises a first bank portion and a second bank portion, the first bank portion has a first bottom surface and a first side surface connected to the first bottom surface, the first bottom surface is a surface of the first bank portion adjacent to the array substrate, the second bank portion has a second bottom surface and a second side surface connected to the second bottom surface, the second bottom surface is a surface of the second bank portion away from the array substrate, and a height of the one of the plurality of bank structures is more than or equal to a height of the one of the plurality of micro light-emitting diodes; and
an optical coating layer disposed on a surface of the one of the plurality of bank structures.

2. The display device according to claim 1, wherein a first included angle is formed between the first side surface and the first bottom surface, the first included angle is between 30 degrees and 150 degrees but not equal to 90 degrees.

3. The display device according to claim 2, wherein a second included angle is formed between the second side surface and the second bottom surface, and the second included angle is between 30 degrees and 150 degrees but not equal to 90 degrees, wherein the first bank portion and the second bank portion are connected to each other, the first included angle is different from the second included angle.

4. The display device according to claim 1, further comprising:
a protective layer disposed above the one of the plurality of micro light-emitting diodes.

5. The display device according to claim 1, further comprising:
a scattering material disposed in the one of the plurality of accommodating regions, and covering the one of the plurality of micro light-emitting diodes.

6. The display device according to claim 1, further comprising:
a wavelength converting material disposed in the one of the plurality of accommodating regions, and covering the one of the plurality of micro light-emitting diodes.

7. A display device, comprising:
an array substrate;
an opposite substrate disposed opposite to the array substrate;
a plurality of micro light-emitting diodes arranged in an array on the array substrate;
a plurality of bank structures located between the array substrate and the opposite substrate, wherein the plurality of micro light-emitting diodes are electrically connected to the array substrate, the plurality of bank structures form a plurality of accommodating regions, one of the plurality of micro light-emitting diodes is located in one of the plurality of accommodating regions, one of the plurality of bank structures comprises a first bank structure and a second bank structure, the first bank structure has a first flat surface and a first inclined surface opposite to each other, the second bank structure has a second flat surface and a second inclined surface opposite to each other, the first inclined surface faces the second inclined surface, a first air gap is formed between the first bank structure and the second bank structure, a width of the first bank structure and a width of the second bank structure gradually increase from the array substrate to the opposite substrate, a first included angle is formed between the first inclined surface and the array substrate, a second included angle is formed between the second inclined surface and the array substrate, and the first included angle and the second included angle are more than or equal to 30 degrees and less than 90 degrees, and a height of the one of the plurality of bank structures is more than or equal to a height of the one of the plurality of micro light-emitting diodes; and
an optical coating layer disposed on a surface of the one of the plurality of bank structures.

8. The display device according to claim 7, further comprising:
a scattering material disposed in the one of the plurality of accommodating regions, and covering the one of the plurality of micro light-emitting diodes.

9. The display device according to claim 7, further comprising:
a wavelength converting material disposed in the one of the plurality of accommodating regions, and covering the one of the plurality of micro light-emitting diodes.

10. The display device according to claim 9, further comprising:
a color filter layer disposed above the opposite substrate and having a plurality of color filter patterns.

11. The display device according to claim 7, further comprising:
a filler material disposed in the one of the plurality of accommodating regions around the one of the plurality of micro light-emitting diodes, and exposing an upper surface of the one of the plurality of micro light-emitting diodes relatively far away from the array substrate; and
a wavelength converting material disposed in the one of the plurality of accommodating regions, and covering the filler material and the upper surface of the one of the plurality of micro light-emitting diodes.

12. The display device according to claim 11, further comprising:
a color filter layer disposed above the opposite substrate and having a plurality of color filter patterns.

13. The display device according to claim 7, wherein a second air gap is formed between the plurality of bank structures and the opposite substrate, the opposite substrate comprises a plurality of light absorbing patterns, the plurality of light absorbing patterns are located in the second air gap, and one of the plurality of light absorbing patterns is disposed corresponding to one of the first air gap.

14. The display device according to claim 13, further comprising:
a protective layer disposed above the one of the plurality of micro light-emitting diodes and a top surface of the one of the plurality of bank structures relatively far away from the array substrate.

* * * * *